(12) United States Patent
Ramakrishnan et al.

(10) Patent No.: US 10,250,273 B2
(45) Date of Patent: Apr. 2, 2019

(54) BAND SPECIFIC INTERLEAVING MISMATCH COMPENSATION IN RF ADCS

(71) Applicant: TEXAS INSTRUMENTS INCORPORATED, Dallas, TX (US)

(72) Inventors: Sthanunathan Ramakrishnan, Bengaluru (IN); Sashidharan Venkatraman, Hyderabad (IN); Chandrasekhar Sriram, Chennai (IN); Jawaharlal Tangudu, Bengaluru (IN)

(73) Assignee: Texas Instruments Incorporation, Dallas, TX (US)

( * ) Notice: Subject to any disclaimer, the term of this patent is extended or adjusted under 35 U.S.C. 154(b) by 0 days.

(21) Appl. No.: 15/791,538

(22) Filed: Oct. 24, 2017

(65) Prior Publication Data

US 2018/0175873 A1 Jun. 21, 2018

(30) Foreign Application Priority Data

Dec. 16, 2016 (IN) .............................. 201641042879

(51) Int. Cl.
*H03M 1/08* (2006.01)
*H03M 1/10* (2006.01)
*H03M 1/12* (2006.01)

(52) U.S. Cl.
CPC ........... *H03M 1/08* (2013.01); *H03M 1/1009* (2013.01); *H03M 1/1042* (2013.01); *H03M 1/1215* (2013.01)

(58) Field of Classification Search
CPC .............................. H03M 1/08; H03M 1/1009
USPC .......................... 341/118, 120, 155, 141, 122
See application file for complete search history.

(56) References Cited

U.S. PATENT DOCUMENTS

| | | |
|---|---|---|
| 6,522,282 B1 | 2/2003 | Elbornsson |
| 7,084,793 B2 | 8/2006 | Elbornsson |
| 7,283,074 B2 | 10/2007 | Sheng et al. |
| 7,482,956 B2 | 1/2009 | Huang et al. |
| 7,782,235 B1 | 8/2010 | Velazquez |
| 7,916,051 B1 | 3/2011 | Sestok et al. |
| 7,961,123 B2 | 6/2011 | Nagarajan et al. |

(Continued)

OTHER PUBLICATIONS

Behzad Razavi, "Problem of Timing Mismatch in Interleaved ADCs," Publisher IEEE, Sep. 2012, pp. 1-8.

*Primary Examiner* — Peguy Jean Pierre
(74) *Attorney, Agent, or Firm* — Michelle F. Murray; Charles A. Brill; Frank D. Cimino

(57) ABSTRACT

An integrated circuit chip includes an interleaved analog-to-digital converter (ADC) and an interleaving calibration circuit. The interleaved ADC includes a plurality of ADCs that are each configured to sample an analog signal. The interleaved ADC is configured to convert the analog signal into an interleaved analog-to-digital signal (IADC signal) that includes a plurality of spurious signals formed from mismatches between the plurality of ADCs. The interleaving calibration circuit is configured to receive the IADC signal from the interleaved ADC, generate a mismatch profile estimate corresponding to the plurality of spurious signals to generate one or more mismatch profile estimates, determine whether a first mismatch profile estimate is in a frequency band of interest, and, in response to a determination that the first mismatch profile estimate is in the frequency band of interest, generate a set of model parameters based on the first mismatch profile estimate.

19 Claims, 4 Drawing Sheets

(56) References Cited

U.S. PATENT DOCUMENTS

| | | | |
|---|---|---|---|
| 8,310,387 B2 * | 11/2012 | Harris | H03M 1/0836 341/118 |
| 8,659,454 B2 | 2/2014 | Sugimoto et al. | |
| 8,836,550 B2 | 9/2014 | Snelgrove | |
| 8,928,507 B2 | 1/2015 | Taluja et al. | |
| 9,184,762 B2 | 11/2015 | Ramakrishnan et al. | |
| 2013/0069812 A1 * | 3/2013 | Waltari | H03M 1/0626 341/166 |
| 2013/0121388 A1 * | 5/2013 | Tseng | H04B 1/0475 375/221 |

* cited by examiner

BAND SPECIFIC INTERLEAVING MISMATCH COMPENSATION IN RF ADCS

CROSS-REFERENCE TO RELATED APPLICATIONS

The present application claims priority to Indian Provisional Patent Application No. 201641042879, filed Dec. 6, 2016, titled "Interleaving Mismatch Compensation with Band Protection in RF Sampling ADCs," which is hereby incorporated herein by reference in its entirety.

BACKGROUND

An analog-to-digital converter (ADC, A/D converter, or A to D) is a device that converts a continuous physical quantity (e.g., voltage) into a digital value that represents the quantity's amplitude. The analog-to-digital conversion involves quantization of the input, such that a small amount of error is introduced. Moreover, instead of doing a single conversion, an ADC often performs the conversions ("samples" the input) periodically. The result is a sequence of digital values that have been converted from a continuous-time and continuous-amplitude analog signal to a discrete-time and discrete-amplitude digital signal.

A time-interleaved ADC uses N parallel ADCs such that each ADC samples data every Nth cycle of the effective sample clock, where N is a positive integer. The result is that the sample rate is increased N times compared to what each individual ADC can manage.

SUMMARY

In accordance with at least one embodiment of the disclosure, an integrated circuit chip includes an interleaved analog-to-digital converter (ADC) and an interleaving calibration circuit. The interleaved ADC includes a plurality of ADCs that are each configured to sample an analog signal. The interleaved ADC is configured to convert that analog signal into an interleaved analog-to-digital signal (IADC signal) that includes a plurality of spurious signals formed from mismatches between the plurality of ADCs. The interleaving calibration circuit is configured to receive the IADC signal from the interleaved ADC, generate a mismatch profile estimate corresponding to the plurality of spurious signals to generate one or more mismatch profile estimates, determine whether a first mismatch profile estimate in the one or more mismatch profile estimates is in a frequency band of interest, and, in response to a determination that the first mismatch profile estimate is in the frequency band of interest, generate a set of model parameters based on the first mismatch profile estimate.

Another illustrative embodiment is an interleaving calibration circuit that includes a mismatch profile estimation circuit, an in-band estimate identifier circuit, and an out-of-band estimate pruning circuit. The mismatch profile estimation circuit is configured to receive an IADC signal that includes a plurality of spurious signals formed from mismatches between a plurality of ADCs. The mismatch profile estimation circuit is also configured to generate a mismatch profile estimate corresponding to the plurality of spurious signals to generate one or more mismatch profile estimates. The in-band estimate identifier is configured to determine whether each mismatch profile estimate in the one or more mismatch profile estimates is in a frequency band of interest. The out-of-band estimate pruning circuit is configured to identify all mismatch profile estimates in the one or more mismatch profile estimates that are outside the frequency band of interest to generate a set of rejected mismatch profile estimates.

Yet another illustrative embodiment is a method for compensating for interleaving ADC mismatch. The method includes receiving an IADC signal that includes a plurality of spurious signals formed from mismatches between a plurality of ADCs. The method also includes generating a mismatch profile estimate corresponding to the plurality of spurious signals to generate one or more mismatch profile estimates. The method also includes determining whether any of the mismatch profile estimates in the one or more mismatch profile estimates is in a frequency band of interest. The method also includes identifying each mismatch profile estimate that is in the frequency band of interest as a selected mismatch profile estimate to generate a set of selected mismatch profile estimates. The method also includes generating a set of model parameters based on the set of selected mismatch profile estimates.

BRIEF DESCRIPTION OF THE DRAWINGS

For a detailed description of various examples, reference will now be made to the accompanying drawings in which.

NOTATION AND NOMENCLATURE

Figure 1:
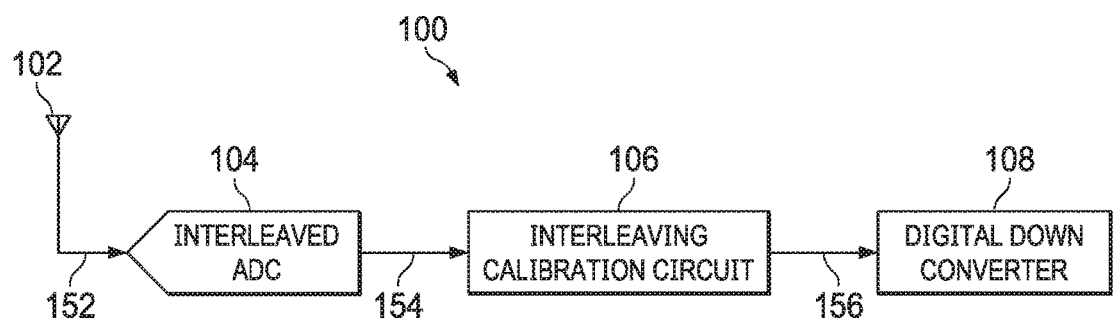
FIG. 1 shows an illustrative block diagram of an integrated circuit chip in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Time-interleaved ADCs use N parallel ADCs such that each ADC samples data every Nth cycle of the effective sample clock, where N is a positive integer. The result is that the sample rate is increased N times compared to what each individual ADC can manage. Each individual ADC in the time-interleaved ADC has a unique gain, sampling time offset, bandwidth, memory, and other unique characteristics. Thus, each individual ADC generates at least a gain mismatch, sampling time offset mismatch (delay mismatch), and memory mismatch relative to a reference ADC (one of the individual ADCs). These mismatches result in spurious signals that have a negative impact on the spurious-free dynamic range (SFDR) of the time-interleaved ADC.

When gain and delay are independent of signal frequency or have a limited dependence on frequency, these mismatches can be estimated using signals that can span a large frequency range. A simple corrector that comprises a frequency independent gain term, a frequency independent delay term, and if needed a single term capturing the frequency variation (denoted as a "memory" term) can be utilized to correcting such mismatches. For example, an estimation/correction model can be used to generate parameters (e.g., filter coefficients) that correspond to the gain, delay, and memory mismatches. A correction filter can then subtract out the spurious signal from the signal output by the time-interleaved ADC utilizing the parameters. However, in real world applications, mismatches are not independent of signal frequency. In other words, the mismatches generated by the multiple ADCs in a time-interleaved ADC are a function of signal frequency. For example, a frequency change in the input signal from 1900 MHz to 2620 MHz can result in a gain mismatch spurious signal level change by −64 dB and a delay mismatch change by approximately 50 femtoseconds, thus changing the delay mismatch spurious signal level by −73 dB. Because these time-interleaving mismatches are a function of frequency, if a frequency independent mismatch estimation/correction model is utilized to generate the parameters, the mismatch estimates need to be averaged across signal frequency to estimate the gain and delay mismatches. However, because the input signal can span a wide frequency range, providing an average frequency estimate to the model generates suboptimal performance across all frequencies.

In order to correct for the frequency dependent spurious signals, conventional systems use a multi-tap mismatch corrector filter structure. For a four ADC time-interleaved ADC, a 24 tap filter is typically required to correct frequency dependent mismatches. Such a filter consumes an undesirable amount of power. Therefore, it is desirable to design a system that corrects for frequency dependent mismatches with relatively low power consumption.

In accordance with various examples, an interleaving calibration circuit is provided that corrects for frequency dependent mismatches while consuming a relatively low amount of power by utilizing a frequency independent correction model. In wireless applications, input signals received by the time-interleaved ADC are present in specific bands (e.g., F band (1880 MHz-1920 MHz), A band (1900 MHz-2000 MHz), D band (2496 MHz-2690 MHz)). In some embodiments, a user may define which of these bands, the system will operate (bands of interest). Only spurious signals that fall within a band of interest will affect the SFDR of the time-interleaved ADC as the spurious signals falling outside a band of interest will be filtered out. Therefore, the interleaving calibration circuit can prune spurious signals with frequencies that are outside of the bands of interest from being utilized by the estimation/correction model to generate parameters (e.g., filter coefficients) that are used to correct the time-interleaved output signal.

More particularly, in an embodiment, the interleaving calibration circuit estimates the frequency domain mismatch profiles generated by the ADCs (e.g., a gain mismatch profile for each ADC, a delay mismatch profile for each ADC, and memory mismatch profile for each ADC as a function of input frequency) of the time-interleaved ADC and determines regions of the mismatch profile which result in a spurious signal that falls within a band of interest. Regions of the estimated mismatch profiles that result in a spurious signal falling within a band of interest are provided to the model to generate the parameters. Mismatch profiles that fall outside the bands of interest are rejected and not provided to the model. Because the mismatch profiles that are within a band of interest are provided to the model to estimate the parameters, the model is fit to the bands of interest. In this way a frequency independent mismatch model provides parameters (e.g., filter coefficients) to correct for time interleaved mismatches while providing relatively good performance for all frequencies and relatively low power consumption.

FIG. 1 shows an illustrative block diagram of an integrated circuit chip 100 in accordance with various examples. The integrated circuit chip 100 can be implemented as an Application Specific Integrated Circuit (ASIC) chip. In some examples, portions of the integrated circuit chip 100 are implemented as firmware accessible by a microcontroller. Additionally or alternatively, some of the blocks illustrated in FIG. 1 can be implemented as logic on a field programmable gate array (FPGA) or a combination of logic and firmware. Moreover, although each block of the integrated circuit chip 100 is shown and described as performing specific functions, it is to be understood that in other examples, the operations of each block can be performed by other blocks and/or in combination with multiple blocks.

The integrated circuit chip 100 includes, in an embodiment, an antenna 102, an interleaved ADC 104, an interleaving calibration circuit 106, and a digital down converter (DDC) 108. The antenna 102, which in some embodiments is part of a receiver, is configured to receive electromagnetic waves and convert those waves into an analog signal 152 (e.g., a current).

The interleaved ADC 102 is configured to receive the analog signal 152 and convert the analog signal into a digital signal. More particularly, the interleaved ADC 102 includes, in an example, an array of N number of ADCs that sample analog signal 152. A sample clock causes each of the N number of ADCs to sample the analog signal 152. Therefore, at each Nth sample, a given ADC samples the analog signal 152. The output signals generated by each of the N number of ADCs is interleaved (e.g., multiplexed) and output as interleaved analog-to-digital signal (IADC signal) 154.

Due to inherent fabrication and design tolerances, each individual ADC in the interleaved ADC 102 has a unique gain, sampling time offset, bandwidth, memory, and other unique characteristics. Thus, each individual ADC 110 in the interleaved ADC 102 generates at least a gain mismatch, sampling time offset mismatch (delay mismatch), and memory mismatch relative to a reference ADC. For example, if the interleaved ADC 102 includes an array of four ADCs, then, one of those ADCs may act as a reference ADC while the remaining three ADCs all will have at least a gain mismatch, sampling time offset mismatch, and memory mismatch relative to the reference ADC. Thus, the IADC signal 154 includes N−1 spurious signals (images of tones) that are a result of the mismatches between the individual ADCs that make up the interleaved ADC 102. Each set of mismatches relative to the reference ADC can be referred to as a mismatch profile. The interleaving calibration circuit 106 is configured to correct these mismatches.

The interleaving calibration circuit 106 is configured to receive the IADC signal 154, including, as discussed above, mismatch profiles from the individual ADCs that make up the interleaved ADC 102. The interleaving calibration circuit 106 is configured to generate a corrected analog-to-digital signal (CADC signal) 156 that compensates for the mismatches. More particularly, the interleaving calibration circuit 106 generates, in an embodiment, an estimation of each of the mismatch profiles that are in the IADC signal 154. For example, if the interleaved ADC 102 includes an array of four ADCs, then three separate mismatch profiles are generated in the IADC signal 154 that provide a mismatch profile for each of the ADCs in reference to the fourth reference ADC. The effect of the individual ADC mismatch profiles with respect to the reference ADC may be denoted by the term $G_k(f)$ (where k=1, 2, 3) which is a complex number that corresponds to the level of the spurious signal at $f+kf_s/4$ where f is the input signal frequency. As shown in these denotations, each of these mismatch profiles, and thus mismatch profile estimates, is frequency dependent.

The interleaving calibration circuit 106 also determines what frequency bands are of interest (i.e., the frequency bands of interest). In some embodiments, a user specifies the frequency bands that are of interest (e.g., the frequency of the incoming signals the user desires to convert from an analog-to-digital signal). For example, a user may specify that the frequency bands of interest are Universal Mobile Telecommunications System—time-division duplexing (UMTS-TDD) bands F (e.g., 1880 MHz-1920 MHz) and D (e.g., 2496 MHz-2690 MHz). These frequency bands of interest, thus, can be predetermined and/or programmable within the interleaving calibration circuit 106.

Once the mismatch profile estimates are generated for each of the ADCs in the interleaved ADC 104, the interleaving calibration circuit 106 determines whether any of the mismatch profile estimates (e.g., $G_k(f)$) result in spurious images within any of the frequency bands of interest. If a mismatch profile estimate has a frequency that does not fall within any of the frequency bands of interest (i.e., has a frequency that falls outside any of the frequency bands of interest), the interleaving calibration circuit 106 identifies that mismatch profile estimate as a rejected mismatch profile estimate. If a mismatch profile estimate has a frequency that falls within any of the frequency bands of interest, the interleaving calibration circuit 106 identifies that mismatch profile estimate as a selected mismatch profile estimate. All of the mismatch profile estimates that are identified as a selected mismatch profile estimate form a set of selected mismatch profiles while all of the mismatch profile estimates that are identified as a rejected mismatch profile estimate form a set of rejected mismatch profile estimates.

The interleaving calibration circuit 106 generates a specific set of corrector model parameters (i.e., filter coefficients) based on the set of selected mismatch profile estimates. For example, the interleaving calibration circuit 106 is, in an embodiment, configured to generate three corrector model parameters: (a) a frequency independent gain mismatch parameter, δ; (b) a frequency independent sampling delay mismatch parameter, τ; and (c) a single memory coefficient parameter, γ utilizing only the mismatch profile estimates in the set of selected mismatch profile estimates. Thus, the interleaving calibration circuit 106 can include a filter (e.g., a Kalman filter) to generate the model parameters. For example the filter can utilize a transfer function to generate the corrector model parameters that is defined by the filter function:

$$H_i(f) = \delta_i + j2\pi f \tau_i + \gamma_i e^{-j4\pi \frac{f}{s}}, \; i = 1, 2, 3 \qquad \text{Equation 1}$$

In some embodiments, if the set of selected mismatch profile estimates is too small, the mismatch profile estimates tracked by the filter in the interleaving calibration circuit 106 can begin to drift, thus, degrading the performance of the filter. Therefore, as will be discussed in more detail below, one or more of the rejected mismatch profile estimates can be added to the set of selected mismatch profile estimates in order to stabilize the filter. Once the corrector model parameters are generated, the interleaving calibration circuit 106 can correct the mismatches, in some embodiments utilizing one or more correction filters, to generate the CADC signal 156 with a relatively high SFDR.

The DDC 108 is configured to receive the CADC signal 156. The DDC 108, in an embodiment, converts the CADC signal 156 from a first frequency to a second frequency that is lower than the first frequency. In other words, the DDC 108 lowers the frequency of the CADC signal 156. The output of the DDC 108 is a digital signal that can then be utilized by other components for processing.

Figure 2:
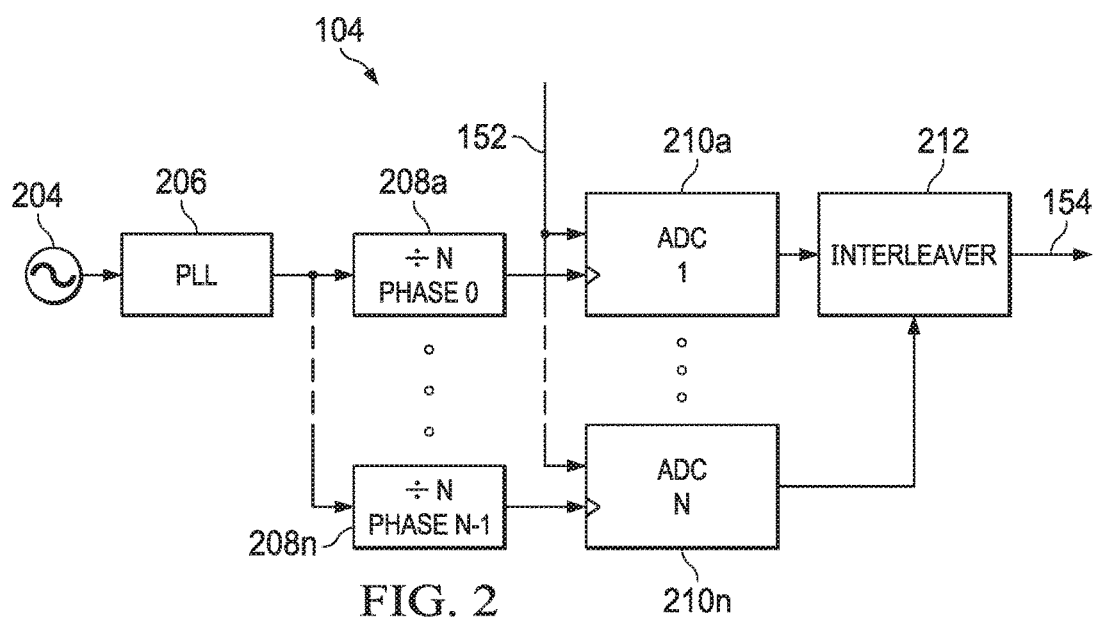
FIG. 2 shows an illustrative block diagram of an interleaved ADC on an integrated circuit chip in accordance with various examples.

FIG. 2 shows an illustrative block diagram of interleaved ADC 104 in accordance with various examples. The interleaved ADC 104 includes, in an embodiment a clock signal 204, a phase locked loop (PLL) 206, N number frequency dividers 208a-n, N number ADCs 210a-n, and an interleaver 212. In an example, the clock signal 204 is provided to PLL 206. The output of the PLL 206 is then provided to N number of frequency dividers 208a-n. The frequency dividers 208a-n each control the sampling of a corresponding ADC 210a-n. For example, frequency divider 208a controls the sampling of ADC 210a and frequency divider 210n controls the sampling of ADC 210n.

The PLL 206 outputs a clock signal and each frequency divider 208a-n divides the output of the PLL 206 by N. For example, if output of the PLL 206 has a frequency of 1 GHz and there are four ADCs 210a-n, each of the frequency dividers 208a-n generate an output signal at a frequency of 250 MHz, however, at different phases. In some examples, the clock signal 204 is generated internally at the interleaved ADC 104 while in other examples, the clock signal 204 is generated external to the interleaved ADC 104 and/or external to the integrated circuit chip 100. The output of each ADC 210a-n is, in an example, provided to an interleaver 212. The interleaver 212 is configured to multiplex (e.g., combine) the outputs of the ADCs 210a-n to form the IADC signal 154.

As discussed above, one of the ADCs (e.g., ADC 210a) is a reference ADC while the remaining ADCs (e.g., ADC 210n) generate mismatches against the reference ADC. Therefore, the IADC signal 154 generated by the interleaver 212 includes the spurious signals generated by the non-reference ADCs (e.g., ADC 210n).

Figure 3:
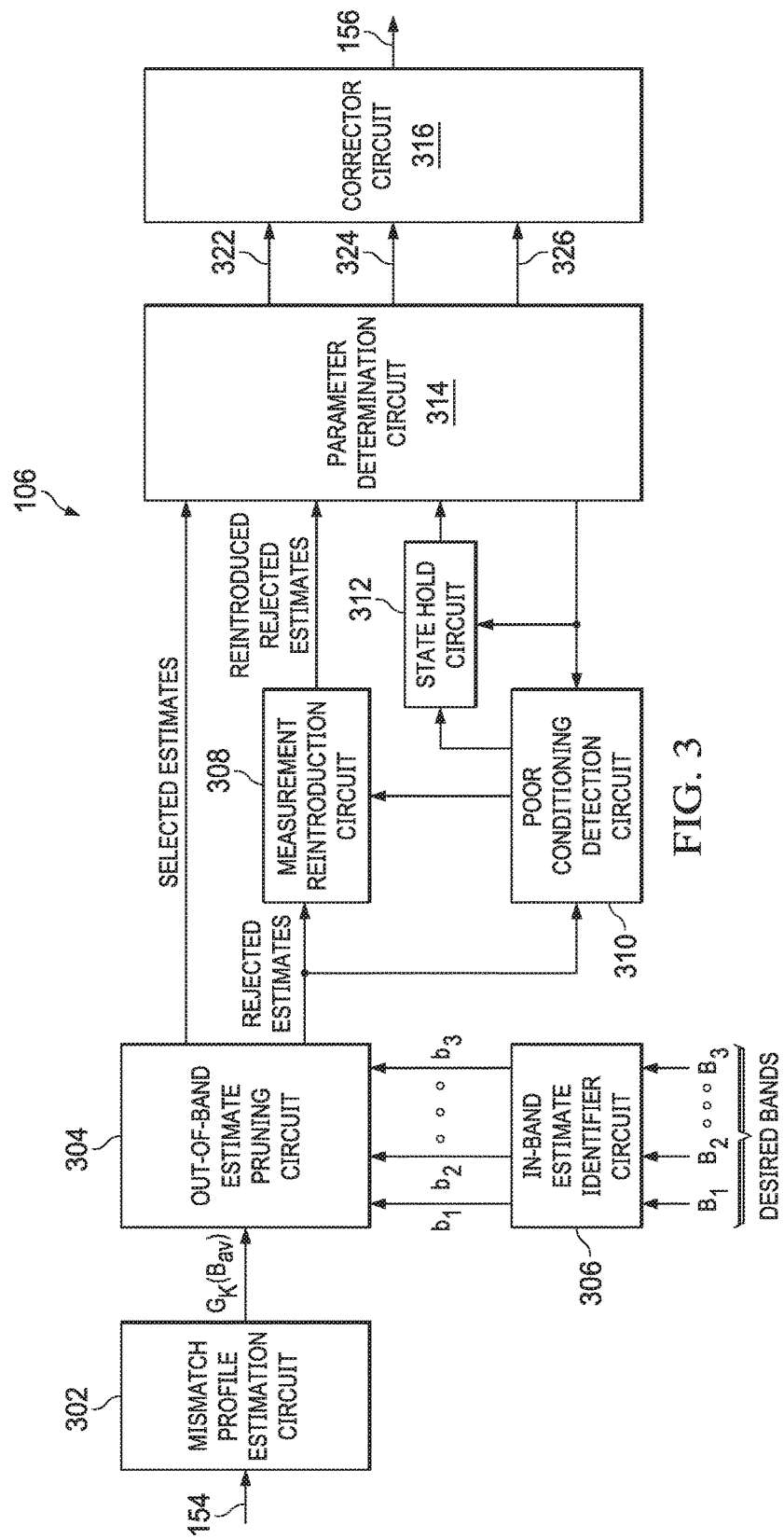
FIG. 3 shows an illustrative block diagram of an interleaving calibration circuit on an integrated circuit chip in accordance with various examples.

FIG. 3 shows an illustrative block diagram of interleaving calibration circuit 106 in accordance with various examples. The interleaving calibration circuit 106 includes, in an embodiment, a mismatch profile estimation circuit 302, an out-of-band estimate pruning circuit 304, an in-band estimate identifier circuit 306, a measurement reintroduction circuit 308, a poor conditioning detection circuit 310, a state hold circuit 312, a parameter determination circuit 314, and a corrector circuit 316.

The mismatch profile estimation circuit 302 is configured to receive the IADC signal 154 (which as discussed above can include a plurality of spurious signals formed from mismatches between the ADCs 210a-n) and generate mismatch profile estimates (labelled as $G_k(b_{av})$) for each of the plurality of spurious signals. In some embodiments, the mismatch profile estimation circuit 302 generates mismatch profile estimates across a variety of frequencies. For example, the mismatch profile estimation circuit 302 can divide the entire ADC spectrum into frequency bins and compute the spurious signal amplitude for each frequency bin.

More particularly, the mismatch profile estimation circuit 302 is configured, in an embodiment, to select (periodically, randomly, and/or pseudo-randomly) and store blocks of the IADC signal 154. The mismatch profile estimation circuit 302 can be configured to apply a windowing function and a Fast Fourier Transform (FFT) function on the selected blocks of the IADC signal 154. Thus, the mismatch profile estimation circuit 302 generates an FFT of the selected blocks that characterizes the spectral content of the IADC signal 154 as a function of contiguous frequency bands referred to as FFT bins.

In some embodiments, the mismatch profile estimation circuit 302 applies a validity check on the FFT bins to reject low power signals and/or mismatches from being processed as valid inputs for estimating the mismatch profile. Additionally, the mismatch profile estimation circuit 302 can perform a second validity check that compares a ratio of a power of a signal bin (an FFT bin containing an image of the given signal/tone) to a threshold value, and if the ratio is less than the threshold value, rejecting the signal bin. The mismatch profile estimation circuit 302 can then determine and accumulate a correlation, signal and image power, and noise variance estimate across the non-rejected FFT bins characterized in the frequency domain.

The mismatch profile estimation circuit 302, in an embodiment, calculates an instantaneous mismatch profile estimate (e.g., a frequency domain mismatch profile estimate) for each selected input frequency bin (denoted by b). Additionally, mismatch profile estimation circuit 302 calculates, in an embodiment, an uncertainty of each instantaneous mismatch profile estimate based on aggregated statistics. Data characterizing the instantaneous mismatch profile estimate and the corresponding uncertainty can be employed by the mismatch profile estimation circuit 302 to interpolate the mismatch profile estimate for each of ADC 210a-n over a range of frequencies.

The in-band estimate identifier circuit 306 is configured to determine whether each mismatch profile estimate that is generated by the mismatch profile estimation circuit 302 is in one or more frequency bands of interest. For example, the in-band estimate identifier circuit 306, in an embodiment, receives the frequency bands of interest (labelled $B_1$, $B_2$, $B_3$). In some embodiments, as discussed above, a user specifies the frequency bands that are of interest (e.g., the frequency of the incoming signals the user desires to convert from an analog-to-digital signal). In other embodiments, the frequency bands of interest are generated by a circuit or any other means. The in-band estimate identifier circuit 306 selects the frequency bins (labelled $b_1$, $b_2$, $b_3$) generated by the mismatch profile estimation circuit 302, whose mismatch profile estimates fall in a band of interest $B_1$, $B_2$, $B_3$. In other words, the operation of the in-band estimate identifier circuit 306 can be as follows:

{$b_1|G_1$ image of $b_1$ falls in $(B_1 \cup B_2 \cup B_3)$},
{$b_2|G_2$ image of $b_2$ falls in $(B_1 \cup B_2 \cup B_3)$},
{,$b_3|G_3$ image of $b_3$ falls in $(B_1 \cup B_2 \cup B_3)$}.

In some embodiments, the bins $b_1$, $b_2$, $b_3$ whose mismatch profile estimates fall in a band of interest $B_1$, $B_2$, $B_3$ are expanded by a programmable frequency (e.g., by 40 MHz) on one or more sides of the bin. In some embodiments, the bins $b_1$, $b_2$, $b_3$ are received directly from a user in addition to or instead of the band of interest $B_1$, $B_2$, $B_3$.

The out-of-band pruning circuit 304 is, in an embodiment, configured to identify all the mismatch profile estimates that are outside the frequency band of interest to generate a set of rejected mismatch profile estimates and/or identify all the mismatch profile estimates that are in the frequency band of interest to generate a set of selected mismatch profile estimates. For example, the bins $b_1$, $b_2$, $b_3$ that include mismatch profile estimates that fall in a frequency band of interest $B_1$, $B_2$, $B_3$ are received by the out-of-band pruning circuit 304 from the in-band estimate identifier circuit 306. The out-of-band pruning circuit 304 rejects the mismatch profile estimates that are in frequency bins other than $b_1$, $b_2$, $b_3$. The remaining mismatch profile estimates make up the selected mismatch profile estimates.

The parameter determination circuit 314 is configured, in an embodiment, to receive the selected mismatch profile estimates and generate the set of model parameters 322-326 (e.g., (a) a frequency independent gain mismatch parameter, $\delta$; (b) a frequency independent sampling delay mismatch parameter, $\tau$; and (c) a single memory coefficient parameter, $\gamma$) utilizing only the mismatch profile estimates in the set of selected mismatch profile estimates. In some embodiments, the parameter determination circuit 314 is a Kalman filter; however, in other embodiments, any type of tracking filter can be used. Because the mismatch profile estimates of frequencies whose spurious signals do not fall in a band of interest are not used for the model estimation, the parameter determination circuit 314 is able to fit the model in a more effective way.

For example, the filter transfer function $H_1(f)$ is related to the selected frequency domain mismatch profile estimates through a four point FFT operation (assuming a four ADC 210a-n interleaved ADC 104) on 0, Ha), $H_2(f)$, $H_3(f)$ by:

$$G_k(f) = \frac{1}{4}\sum_{i=1}^{3} H_i(f)e^{\frac{j2\pi ki}{4}}, k = 1, 2, 3 \qquad \text{Equation 2}$$

Internally, the parameter determination circuit 314 is configured to maintain nine state elements (e.g., $\delta_1$, $\delta_2$, $\delta_3$, $\tau_1$, $\tau_2$, $\tau_3$, $\gamma_1$, $\gamma_2$, and $\gamma_3$) and their respective uncerainty metrics generated by the mismatch profile estimation circuit 302. The operation of the parameter determination circuit 314 can be as follows:

$$G_1(b) = \frac{-j\delta_1 - \delta_2 + j\delta_3}{4} + \frac{-j\tau_1 - \tau_2 + j\tau_3}{4 * j2\pi k/N} + \frac{-j\gamma_1 - \gamma_2 + j\gamma_3}{4 * e^{j\pi 2k/N}} + \text{noise} \qquad \text{Equation 3}$$

-continued $$G_2(b) = \frac{-\delta_1 + \delta_2 - \delta_3}{4} + \frac{-\tau_1 + \tau_2 - \tau_3}{4*j2\pi k/N} + \frac{-\gamma_1 + \gamma_2 - \gamma_3}{4*e^{j\pi 2k/N}} + \text{noise} \quad \text{Equation 4}$$

$$G_3(b) = \frac{j\delta_1 - \delta_2 - j\delta_3}{4} + \frac{j\tau_1 - \tau_2 - j\tau_3}{4*j2\pi k/N} + \frac{j\gamma_1 - \gamma_2 + j\gamma_3}{4*e^{j\pi 2k/N}} + \text{noise} \quad \text{Equation 5}$$

where N is the number of FFT bins and b is the bin index. Additionally, $$\delta'_1 = \frac{(-\delta_1 + \delta_2 - \delta_3)}{4}, \tau'_1 = \frac{2\pi(-\tau_1 + \tau_2 - \tau_3)}{4}, \quad \text{Equation 6}$$
$$\gamma'_1 = \frac{(-\gamma_1 + \gamma_2 - \gamma_3)}{4}$$

$$\delta'_2 = \frac{\delta}{4}, \tau'_2 = \frac{2\pi\tau}{4}, \gamma'_2 = \frac{\gamma}{4} \quad \text{Equation 7}$$

$$\delta'_3 = \frac{(-\delta_1 + \delta_3)}{4}, \tau'_3 = \frac{(-\tau_1 + \tau_3)}{4}, \gamma'_3 = \frac{(-\gamma_1 + \gamma_3)}{4} \quad \text{Equation 8}$$

These equations (Equations 6-8) can be split into two sets of equations, one to estimate $\delta'_1$, $\tau'_1$, and $\gamma'_1$ (e.g., states for a first Kalman Filter) and the other to estimate $\delta'_2$, $\tau'_2$, $\gamma'_2$, $\delta'_3$, $\tau'_3$, and $\gamma'_3$ (e.g., states for a second Kalman Filter). The measurement equations for the first Kalman Filter are:

$$\begin{bmatrix} \text{Re}(G_2(b_0)) \\ \ldots \\ \text{Re}(G_2(b_{M-1})) \\ \text{Im}(G_2(b_0)) \\ \ldots \\ \text{Im}(G_2(b_{M-1})) \end{bmatrix} = \begin{bmatrix} 1 & 0 & \cos(2\pi 2b_0/N) \\ \ldots & \ldots & \ldots \\ 1 & 0 & \cos(2\pi 2b_0/N) \\ 0 & b_0/N & -\sin(2\pi 2b_0/N) \\ \ldots & \ldots & \ldots \\ 0 & b_{M-1}/N & -\sin(2\pi 2b_{M-1}/N) \end{bmatrix} \begin{bmatrix} \delta'_1 \\ \tau'_1 \\ \gamma'_1 \end{bmatrix} \quad \text{Equation 9}$$

where $b_0 \ldots b_{M-1}$ are the bin indices of the M instantaneous G(f) measurements available. The measurement equations for the second Kalman Filter are:

Equation 10

$$\begin{bmatrix} \text{Re}(G_1(b_0)) \\ \ldots \\ \text{Re}(G_1(b_{M-1})) \\ \text{Im}(G_1(b_0)) \\ \ldots \\ \text{Im}(G_1(b_{M-1})) \\ \text{Re}(G_3(b_0)) \\ \ldots \\ \text{Re}(G_3(b_{M-1})) \\ \text{Im}(G_3(b_0)) \\ \ldots \\ \text{Im}(G_3(b_{M-1})) \end{bmatrix} = \begin{bmatrix} -1 & 0 & -\cos(2\pi 2b_0/N) & 0 & -b_0/N & \sin(2\pi 2b_0/N) \\ \ldots & \ldots & \ldots & \ldots & \ldots & \ldots \\ -1 & 0 & -\cos(2\pi 2b_{M-1}/N) & 0 & -b_{M-1}/N & \sin(2\pi 2b_{M-1}/N) \\ 0 & -b_0/N & \sin(2\pi 2b_0/N) & 1 & 0 & \cos(2\pi 2b_0/N) \\ \ldots & \ldots & \ldots & \ldots & \ldots & \ldots \\ 0 & -b_{M-1}/N & \sin(2\pi 2b_{M-1}/N) & 1 & 0 & \cos(2\pi 2b_{M-1}/N) \\ -1 & 0 & -\cos(2\pi 2b_0/N) & 0 & b_0/N & -\sin(2\pi 2b_0/N) \\ \ldots & \ldots & \ldots & \ldots & \ldots & \ldots \\ -1 & 0 & -\cos(2\pi 2b_{M-1}/N) & 0 & b_{M-1}/N & -\sin(2\pi 2b_{M-1}/N) \\ 0 & -b_0/N & \sin(2\pi 2b_0/N) & -1 & 0 & -\cos(2\pi 2b_0/N) \\ \ldots & \ldots & \ldots & \ldots & \ldots & \ldots \\ 0 & -b_{M-1}/N & \sin(2\pi 2b_{M-1}/N) & -1 & 0 & -\cos(2\pi 2b_{M-1}/N) \end{bmatrix} \begin{bmatrix} \delta'_2 \\ \tau'_2 \\ \gamma'_2 \\ \delta'_3 \\ \tau'_3 \\ \gamma'_3 \end{bmatrix}$$

In some embodiments, there may be situations that no mismatch profile estimate falls in a band of interest. Because the out-of-band estimate pruning circuit 304 rejects mismatch profile estimates that do not fall into a band of interest, there not be any mismatch profile estimates received (as selected estimates) by the parameter determination circuit 314. This can cause the gain, delay, and/or memory mismatch estimates being tracked in the parameter determination circuit 314 to drift. Due to this drift, the parameters 322-326 generated by the parameter determination circuit 314 may saturate. Once the parameters 322-326 saturate, performance of the system may degrade.

Therefore, the poor conditioning detector 310 is configured, in an embodiment, to detect whether the parameter determination circuit 314 mismatch estimates are prone to drift based on the number of estimates being received by the parameter determination circuit 314. Therefore, the poor conditioning detector 310 is configured, in an embodiment, to determine whether the number of mismatch profile estimates in the set of selected mismatch profile estimates (the mismatch profile estimates being received by the parameter determination circuit 314) is greater than a threshold value. If the number of mismatch profile estimates is less than the threshold value, the poor conditioning detection circuit 310 is configured to generate an alarm. For example, the poor conditioning detection circuit 310 will, in an embodiment, generate an alarm if the number of mismatch profile estimates for $G_1$ and $G_3$ together is 1 or 2 (for a four ADC 210 interleaved ADC 104). In some embodiments, if adjacent mismatch profile estimates (e.g., $G_1$ and $G_2$) alone fall in a band of interest, the poor conditioning detection circuit 310 will generate a count of 1 mismatch profile estimate when determining whether the number of mismatch profile estimates is less than the threshold value because these estimates can be correlated. In some embodiments, the poor conditioning detection circuit 310 will also generate an alarm if the uncertainty of the mismatch estimates generated in the mismatch profile estimation circuit 302 that are selected mismatch profile estimates is greater than a threshold level and generate an alarm if the uncertainty is greater than the threshold level.

If the poor conditioning detector circuit 310 triggers an alarm, the measurement reintroduction circuit 308 is configured to reintroduce the rejected mismatch profile estimate that has a frequency that is closest to a frequency band of interest. In other words, the measurement reintroduction circuit 308 is, in an embodiment, configured, in response to an alarm being generated by the poor conditioning detector circuit 310, to determine which of the mismatch profile estimates in the set of rejected mismatch profile estimates corresponds to an input frequency which results in a spurious signal falling within the frequency bands of interest. The measurement reintroduction circuit 308 then can remove that mismatch profile estimate (the mismatch profile estimate that corresponds to an input frequency which is closest to an input frequency which results in a spurious signal falling within the frequency bands of interest) from the set of rejected mismatch profile estimates and add that mismatch profile estimate (the mismatch profile estimate that corresponds to an input frequency which is closest to an input frequency which results in a spurious signal falling within the frequency bands of interest) to the set of selected mismatch profile estimates. The parameter determination circuit 314, as before, receives the set of selected mismatch profile estimates (including the reintroduced estimate) and generates the parameters 322-326 based on the set of selected mismatch profile estimates as discussed above. This ensures that the parameters 322-326 do not drift and saturate due to the absence of mismatch profile estimates.

In some embodiments, even if all the mismatch profile estimates are selected (e.g., $G_1$, $G_2$, and $G_3$) for a single tone by the in-band estimate identifier circuit 306 and out-of-band estimate pruning circuit 304, drifting in the parameter determination circuit 314 may still occur. When a single tone is input into the time-interleaved ADC 104, the mismatch profile estimation circuit 302 generates mismatch profile estimates for that tone only. This implies there may be less equations (e.g., real and imaginary part of $G_1$, $G_2$, and $G_3$) than parameters to be estimated (e.g., gain, delay, and memory mismatch for each of samples 1, 2, and 3 when sample 0 is the reference in a 4 ADC time-interleaved ADC). This may cause drift in the gain, delay, and memory parameters generated by the parameter determination circuit 314. Therefore, the poor conditioning detection circuit 310 can also be configured to detect this condition and trigger an alarm if the condition is detected (e.g., there are too few mismatch profile estimates for the number parameters needed to be calculated). In response to such an alarm being triggered, the state hold circuit 312 can be configured to hold the state of the parameters in the parameter determination circuit 314. For example, if the number of $G_2$ measurements is one, then the state hold circuit 312 can be configured to hold the state of the first Kalman Filter. However, if the number of $G_1$ and $G_3$ measurements is two, then the state hold circuit 312 can be configured to hold the state of the second Kalman Filter. The state hold circuit 312 is configured, in an embodiment, to constrain the memory mismatch parameter be either generating a specific value of memory mismatch and provide the specific value of memory mismatch to the parameter determination circuit 314 or generating a function of a past memory mismatch to the parameter determination circuit 314.

The corrector circuit 316 is, in an embodiment, configured to receive the parameters 322-326 (e.g., filter coefficients). The corrector circuit 316 can employ the parameters 322-326 in correction filters to subtract the spurious signals of the tone caused by the interleaving of the N number of ADCs 210*a-n* and output the CADC signal 156.

Figure 4:
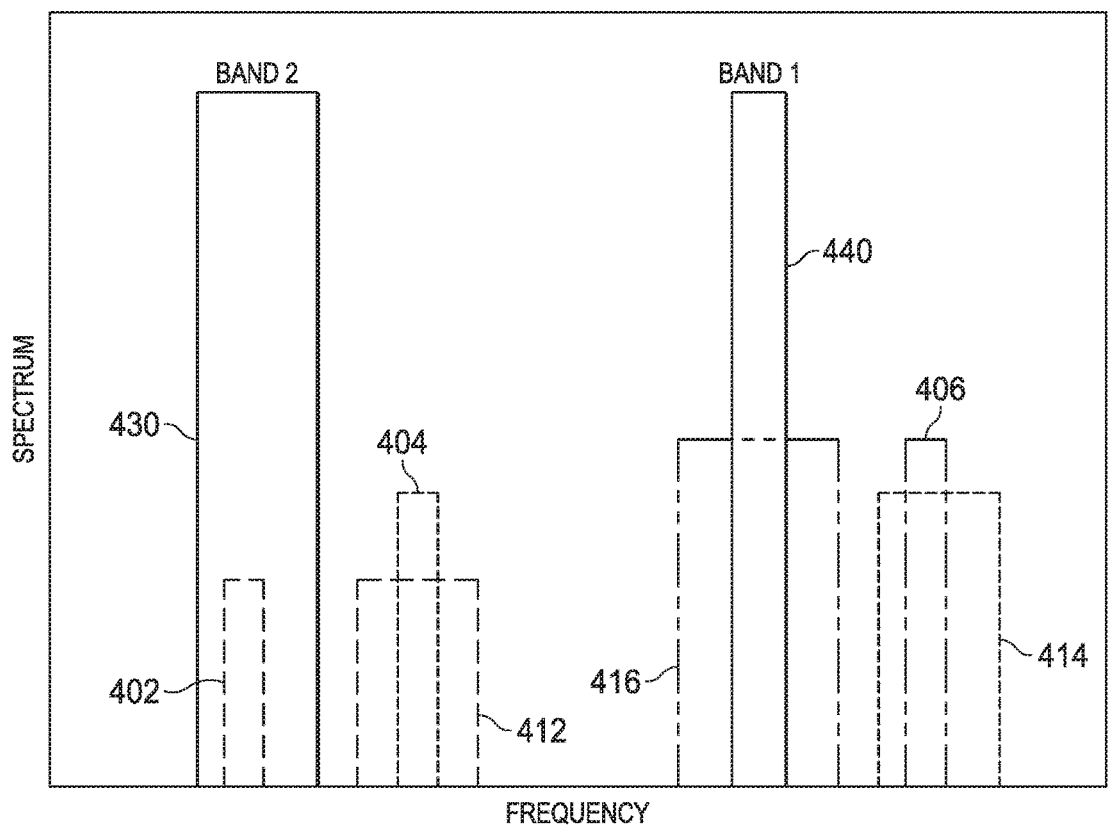
FIG. 4 shows an illustrative spectrum versus frequency graph of frequency bands of interest and spurious signals in accordance with various examples.

FIG. 4 shows an illustrative spectrum versus frequency graph 400 of frequency bands of interest 430, 440 and spurious signals 402-406 and 412-416 in accordance with various examples. In the example graph 400, a user has provided two bands of interest 430 and 440. For example, band 440 may be D band (e.g., 2496 MHz-2690 MHz) and band 430 may be F band (e.g., 1880 MHz-1920 MHz). Therefore, the analog signal 152 received from the antenna 102 should be have a frequency in one of those two frequency bands. As discussed above, the analog signal 152 is received by the interleaved ADC 104 and an IADC signal 154 is output. The IADC signal 154 can contain spurious signals. For example, for an analog signal 152 received in band 440, the spurious signals 402 (corresponding to mismatch profile estimate $G_3$), 404 (corresponding to mismatch profile estimate $G_2$), and 406 (corresponding to mismatch profile estimate $G_1$) can be present in the IADC signal 154. Similarly, for an analog signal 152 received in band 430, the spurious signals 412 (corresponding to mismatch profile estimate $G_3$), 414 (corresponding to mismatch profile estimate $G_2$), and 416 (corresponding to mismatch profile estimate $G_1$) can be present in the IADC signal 154. As discussed above, the in-band estimate identifier circuit 306 and out-of-band estimate pruning circuit 304 reject, from mismatch estimates that are not in a frequency band of interest. Therefore, in this example, the estimates for spurious signals 404, 406, 412, and 414 are rejected and become part of the set of rejected mismatch profile estimates. However, because the spurious signals 402 and 416 have frequencies that fall within the frequency of a band of interest (e.g., 430, 440), the estimates for spurious signals 402 and 406 remain part of the set of selected mismatch profile estimates provided to the parameter determination circuit 314.

Figure 5:
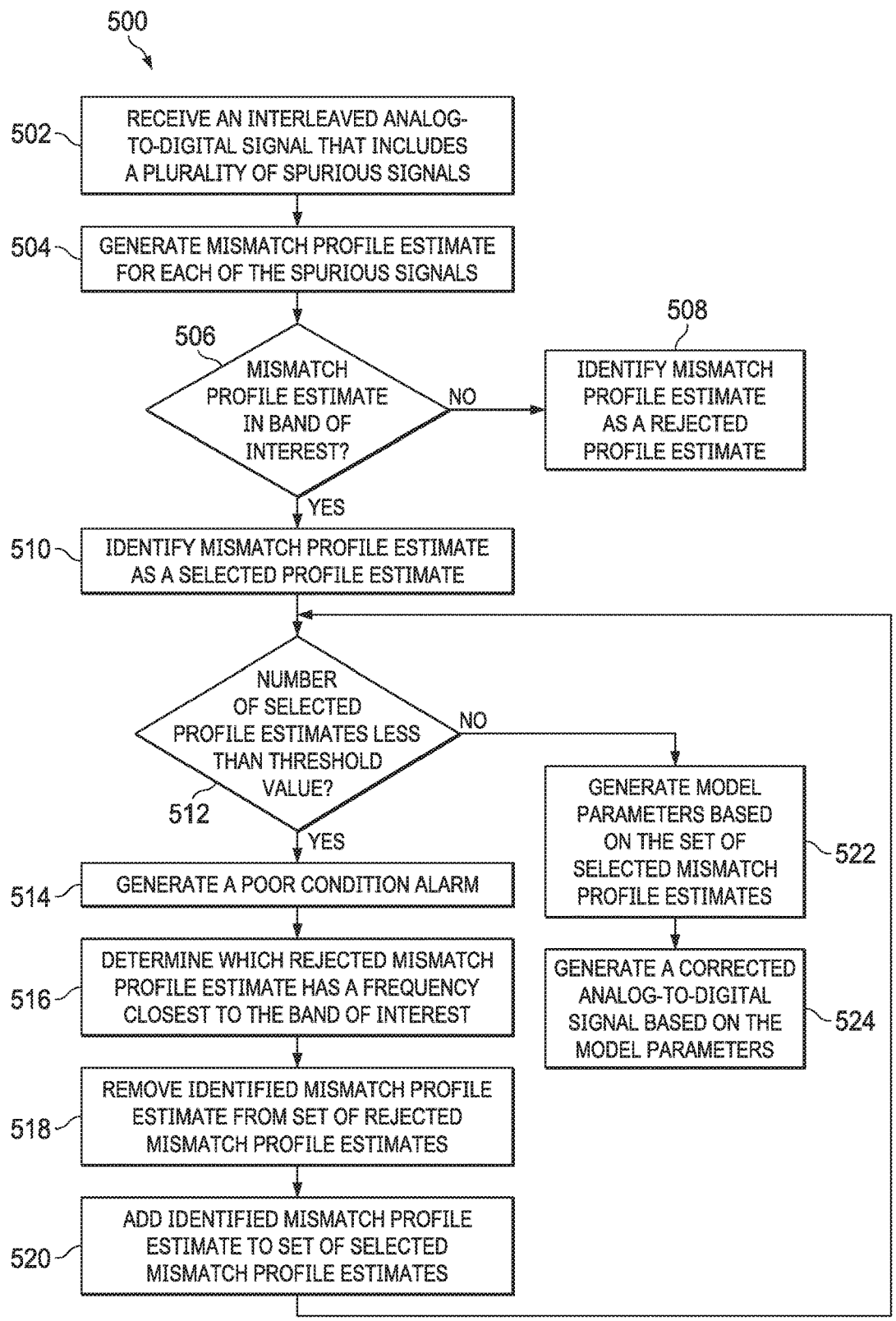
FIG. 5 shows an illustrative flow diagram of a method of compensating for interleaving ADC mismatch in accordance with various examples.

FIG. 5 shows an illustrative flow diagram of a method 500 of compensating for interleaving ADC mismatch in accordance with various examples. Though depicted sequentially as a matter of convenience, at least some of the actions shown can be performed in a different order and/or performed in parallel. Additionally, some embodiments may perform only some of the actions shown. In some embodiments, at least some of the operations of the method 500, as well as other operations described herein, are performed by the interleaved ADC 104 (including the PLL 206, the dividers 208*a-n*, the ADCs 210*a-n*, and/or the interleaver 212), the interleaving calibration circuit 106 (including the mismatch profile estimation circuit 302, the in-band estimate identifier circuit 306, the out-of-band estimate pruning circuit 304, the measurement reintroduction circuit 308, the poor conditioning detection circuit 310, the state hold circuit 312, the parameter determination circuit 314, and/or the corrector circuit 316), and/or the DDC 108 and implemented in logic.

The method 500 begins in block 502 with receiving an IADC signal that includes a plurality of spurious signals. For example, the mismatch profile estimation circuit 302 can receive the IADC signal 154 from the interleaved ADC 104. In block 504, the method 500 continues with generating one or more mismatch profile estimates for each of the spurious signals. For example, the mismatch profile estimation circuit 302 can generate the mismatch profile estimates.

The method 500 continues in block 506 with determining whether each of the mismatch profile estimates is in a frequency band of interest. For example, the in-band estimate identifier circuit 306 can determine whether each mismatch profile estimate generated by the mismatch profile estimation circuit has a frequency that is within a band of frequencies that, in some embodiments, is provided by a user. If, in block 506, a determination is made that a mismatch profile estimate is not in a frequency band of interest, the method 500 continues in block 508 with identifying the mismatch profile estimate that is not in a frequency band of interest as a rejected mismatch profile estimate. However, if, in block 506, a determination is made that a mismatch profile estimate is in a frequency band of interest, the method 500 continues in block 510 with identifying the mismatch profile estimate that is in a frequency band of interest as a selected mismatch profile estimate.

In block 512, the method 500 continues with determining whether the number of selected mismatch profile estimates is less than a threshold value. For example, the poor conditioning detection circuit 310 can detect whether the number of selected mismatch profile estimates is less than a threshold value. If, in block 512, a determination is made that the number of selected mismatch profile estimates is less than a threshold value, the method 500 continues in block 514 with generating a poor condition alarm. The method 500 continues in block 516 with determining which rejected mismatch profile estimate has a frequency closest to a frequency band of interest. For example, the measurement reintroduction circuit 308 can analyze the rejected mismatch profile estimates (generated in block 508) to determine which of the rejected mismatch profile estimates corresponds to an input frequency which is closest to an input frequency which results in a spurious signal falling within the frequency bands of interest. In block 518, the method 500 continues with removing the identified mismatch profile estimate from the rejected mismatch profile estimates. For example, the measurement reintroduction circuit 308 can remove the mismatch profile estimate in the rejected mismatch profile estimates that corresponds to an input frequency which is closest to an input frequency which results in a spurious signal falling within the frequency bands of interest from the rejected mismatch profile estimates. The method 500 continues in block 520 with adding the identified mismatch profile estimate to the selected mismatch profile estimates. For example, the measurement reintroduction circuit 308 can add the rejected mismatch profile estimates that corresponds to an input frequency which is closest to an input frequency which results in a spurious signal falling within the frequency bands of interest to the selected mismatch profile estimates. The method 500 then returns to block 512 with determining whether the number of selected mismatch profile estimates is less than a threshold value.

However, if, in block 512, a determination is made that the number of selected mismatch profile estimates is not less than a threshold value, the method 500 continues in block 522 with generating model parameters (e.g., filter coefficients) based on the selected mismatch profile estimates. For example, the parameter determination circuit 314 can generate the parameters 322-326 based on the selected mismatch profile estimates. The method 500 continues in block 524 with generating a CADC signal based on the model parameters. For example, the corrector circuit 316 can generate the CADC signal 156.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit chip, comprising:
   an interleaved analog-to-digital converter (ADC), comprising a plurality of ADCs configured to sample an analog signal, the interleaved ADC configured to convert the analog signal into an interleaved analog-to-digital signal (IADC signal); and
   an interleaving calibration circuit coupled to the interleaved ADC, the interleaving calibration circuit configured to:
   receive the IADC signal from the interleaved ADC;
   generate a mismatch profile estimate corresponding to a plurality of spurious signals, to generate one or more mismatch profile estimates;
   in response to determining that a first mismatch profile falls in at least one of a plurality of frequency bands of interest, generate a set of model parameters based on the mismatch profile estimate.

2. The integrated circuit chip of claim 1, wherein the interleaving calibration circuit is further configured to:
   identify all mismatch profile estimates that are in at least one of the plurality of frequency bands of interest, to generate a set of selected mismatch profile estimates; and
   identify all mismatch profile estimates that are outside all of the plurality of frequency bands of interest to generate a set of rejected mismatch profile estimates.

3. The integrated circuit chip of claim 2, wherein the interleaving calibration circuit is further configured to:
   determine whether a number of mismatch profile estimates in the set of selected mismatch profile estimates is greater than a threshold value; and
   in response to the number of mismatch profile estimates in the set of selected mismatch profile estimates being less than the threshold value, generate a poor condition alarm.

4. The integrated circuit chip of claim 3, wherein the interleaving calibration circuit is further configured to, in response to generating the poor condition alarm:
   determine one of the mismatch profile estimates in the set of rejected mismatch profile estimates that corresponds to an input frequency closest to an input frequency which results in a spurious signal falling within at least one of the plurality of frequency bands of interest;
   remove the one of the mismatch profile estimates in the set of rejected mismatch profile estimates that corresponds to the input frequency which is closest to the input frequency which results in the spurious signal within the at least one of the plurality of frequency bands of interest from the set of rejected mismatch profile estimates; and
   add the one of the mismatch profile estimates in the set of rejected mismatch profile estimates that corresponds to the input frequency which is closest to the input frequency which results in the spurious signal within the at least one of the plurality of frequency bands of interest to the set of selected mismatch profile estimates.

5. The integrated circuit chip of claim 4, wherein the interleaving calibration circuit is further configured to generate the set of model parameters based on the set of selected mismatch profile estimates.

6. The integrated circuit chip of claim 1, wherein the interleaving calibration circuit is further configured to generate a corrected analog-to-digital signal (CADC signal) based on the set of model parameters.

7. The integrated circuit chip of claim 1, wherein the set of model parameters comprises a frequency independent gain mismatch parameter, a frequency independent sampling delay mismatch parameter, and a single memory coefficient parameter.

8. An interleaving calibration circuit, comprising:
   a mismatch profile estimation circuit configured to:
   receive an interleaved analog-to-digital signal (IADC signal) that comprises a plurality of spurious signals formed from mismatches between a plurality of analog-to-digital converters (ADCs); and generate a mismatch profile estimate corresponding to the plurality of spurious signals, to generate one or more mismatch profile estimates;

an in-band estimate identifier circuit configured to determine whether each mismatch profile estimate in the one or more mismatch profile estimates is in a frequency band of interest; and an out-of-band estimate pruning circuit configured to identify mismatch profile estimates in the one or more mismatch profile estimates that are outside the frequency band of interest, to generate a set of rejected mismatch profile estimates.

9. The interleaving calibration circuit of claim 8, further comprising a parameter determination circuit configured to generate a set of model parameters in response to determining that a first mismatch profile corresponds to a first spurious signal of the plurality of spurious signals that falls in the frequency band of interest.

10. The interleaving calibration circuit of claim 9, wherein the out-of-band estimate pruning circuit is further configured to identify mismatch profiles in the one or more mismatch profile estimates that are in the frequency band of interest, to generate a set of selected mismatch profile estimates.

11. The interleaving calibration circuit of claim 10, further comprising a poor conditioning detection circuit, configured to:
determine whether a number of mismatch profile estimates in the set of selected mismatch profile estimates is greater than a threshold value; and
in response to the number of mismatch profile estimates in the set of selected mismatch profile estimates being less than the threshold value, generate a poor condition alarm.

12. The interleaving calibration circuit of claim 11, further comprising a state hold circuit configured, in response to receiving the poor condition alarm, to generating a specific value of memory mismatch and provide the specific value of memory mismatch to the parameter determination circuit.

13. The interleaving calibration circuit of claim 11, further comprising a measurement reintroduction circuit configured, in response to receiving the poor condition alarm, to:
determine one of the mismatch profile estimates in the set of rejected mismatch profile estimates that corresponds to an input frequency which is closest to an input frequency which results in a spurious signal falling within the frequency bands of interest;
remove a mismatch profile estimate in the set of rejected mismatch profile estimates that corresponds to the input frequency which is closest to the input frequency which results in the spurious signal within the frequency bands of interest from the set of rejected mismatch profile estimates; and
add a mismatch profile estimate in the set of rejected mismatch profile estimates that corresponds to the input frequency which is closest to the input frequency which results in the spurious signal within the frequency bands of interest to the set of selected mismatch profile estimates.

14. The interleaving calibration circuit of claim 13, wherein the set of model parameters comprises a gain mismatch, a sampling delay mismatch, and a memory mismatch.

15. The interleaving calibration circuit of claim 14, wherein the parameter determination circuit is configured to generate a set of model parameters based on the set of selected mismatch profile estimates and a specific value of memory mismatch.

16. A method for compensating for interleaving analog-to-digital converter (ADC) mismatch, the method comprising:
receiving, by an interleaving calibration circuit from a plurality of ADCs, an interleaved analog-to-digital signal (IADC signal) comprising a plurality of spurious signals formed from mismatches between the plurality of ADCs;
generating, by the interleaving calibration circuit, a mismatch profile estimate corresponding to the plurality of spurious signals, to generate at least one mismatch profile estimate;
and
generating a set of model parameters based on a set of selected mismatch profile estimates, in response to determining that a first mismatch profile falls in at least one of a plurality of frequency bands of interest.

17. The method of claim 16, further comprising:
identifying each mismatch profile estimate that is outside the frequency band of interest as a rejected mismatch profile estimate, to generate a set of rejected mismatch profile estimates;
determining whether a number of mismatch profile estimates in the set of selected mismatch profile estimates is greater than a threshold value; and
in response to the number of mismatch profile estimates in the set of selected mismatch profile estimates being less than the threshold value, generating a poor condition alarm.

18. The method of claim 17, further comprising:
determining one of the mismatch profile estimates in the set of rejected mismatch profile estimates that corresponds to an input frequency which is closest to an input frequency which results in a spurious signal falling within the frequency bands of interest;
removing the one of the mismatch profile estimates in the set of rejected mismatch profile estimates that corresponds to the input frequency which is closest to the input frequency which results in the spurious signal within the frequency bands of interest from the set of rejected mismatch profile estimates; and
adding the one of the mismatch profile estimates in the set of rejected mismatch profile estimates that corresponds to the input frequency which is closest to the input frequency which results in the spurious signal within the frequency bands of interest to the set of selected mismatch profile estimates.

19. The method of claim 18, further comprising, generating a corrected analog-to-digital signal (CADC signal) based on the set of model parameters.

* * * * *